HEBER J. BRESEE
*INVENTOR*
*BY*
*BUCKHORN, BLORE, KLARQUIST & SPARKMAN*
*ATTORNEYS*

MONOLITHIC INTEGRATED CIRCUIT INCLUDING FIELD EFFECT TRANSISTORS AND BIPOLAR TRANSISTORS, AND METHOD OF MAKING

Filed Jan. 11, 1968

INVENTOR.
HEBER J. BRESEE
BY
BUCKHORN, BLORE, KLARQUIST & SPARKMAN
ATTORNEYS

MONOLITHIC INTEGRATED CIRCUIT INCLUDING FIELD EFFECT TRANSISTORS AND BIPOLAR TRANSISTORS, AND METHOD OF MAKING

Filed Jan. 11, 1968 3 Sheets-Sheet 3

INVENTOR.
HEBER J. BRESEE

BY

BUCKHORN, BLORE, KLARQUIST & SPARKMAN
ATTORNEYS

United States Patent Office 3,594,241

Patented July 20, 1971

3,594,241

MONOLITHIC INTEGRATED CIRCUIT INCLUDING FIELD EFFECT TRANSISTORS AND BIPOLAR TRANSISTORS, AND METHOD OF MAKING

Heber J. Bresee, Tigard, Oreg., assignor to Tektronix, Inc., Beaverton, Oreg.

Filed Jan. 11, 1968, Ser. No. 697,055
Int. Cl. H01l 7/34

U.S. Cl. 148—175 13 Claims

ABSTRACT OF THE DISCLOSURE

A monolithic integrated circuit including a plurality of field effect transistors and bipolar transistors formed in a single epitaxial layer on the same semiconductor member and a method for doing so with diffusion steps common to both types of transistors, are described. The top gate of a PN junction gated field effect transistor and the emitter of an NPN bipolar transistor are formed simultaneously, while the source and drain of the field effect transistor and the base of the bipolar transistor are formed simultaneously. The channel portion of the field effect transistor is formed separately with a doping impurity concentration of lower surface value and lower slope than any of the other elements to provide such channel with a high resistance which is more uniform and easier to reproduce.

BACKGROUND OF THE INVENTION

The subject matter of the present invention relates generally to integrated circuits and their manufacture and in particular to a monolithic integrated circuit in which field effect transistors and bipolar transistors are formed in a single epitaxial layer on the same semiconductor member and a diffusion method of manufacture in which at least some of the elements of both types of transistors are formed simultaneously by the same diffusion step. Thus in one embodiment of the invention the source and drain of a PN junction gated field effect transistor are formed simultaneously with the base of an NPN bipolar transistor, while the top gate of the field effect transistor is formed simultaneously with the emitter of the bipolar transistor. The channel portion of the field effect transistor is formed separately with a high sheet resistance on the order of 1000 to 4000 ohms per square, which is easily reproduced in the production of a plurality of integrated circuits for better uniformity of such circuits. This is achieved by providing the doping impurity concentration of the channel portion with a low surface value and a low slope so that such concentration decreases very gradually with distance from the surface to provide the channel with a high resistance which is more uniform and easier to reproduce. Thus the impurity concentration of the channel portion is provided with a lower surface concentration and lower slope than the impurity concentration of the source, drain and base or the impurity concentration of the emitter and top gate.

The high channel resistance enables the field effect transistor in the integrated circuit of the present invention to have high reverse bias breakdown voltages similar in magnitude to conventional single discreet field effect transistors. In addition the integrated circuit is provided with lower reverse bias leakage current by employing metal leads which are in contact with only inner portions of the transistor elements including ohmic contact areas, so that such metal contacts are surrounds by outer barrier portions of such element. In the present field effect transistor the barrier portion is a P type barrier formed by outer portions of the source and drain, which is between the metal contact and the low impurity concentration channel area to reduce the leakage current that is normally prevalent at the surface of a lightly doped junction.

Previous commercially available integrated circuits have not combined field effect transistors with the bipolar transistors because of the expense and difficulty of fabrication of such integrated circuits with transistors of as good characteristics as those of single discreet transistors. These problems have been overcome in the method of the present invention, which uses few diffusion steps and provides an integrated circuit with field effect transistors having the necessary high channel resistance in a manner which can be reproduced to enable a plurality of such integrated circuits to be manufactured with uniform characteristics.

The method of the present invention may be employed to make integrated circuits having field effect transistors of the PN junction gated type, as well as of the insulated gate type such as "MOS" field effect transistors. In addition, the present integrated circuits may be provided with a PN junction gated field effect transistor having a single gating junction provided only beneath the channel portion of such transistors, as shown in copending U.S. patent application, Ser. No. 670,735, filed Sept. 26, 1967 by H. J. Bresee.

It is therefore one object of the present invention to provide an improved integrated circuit in which field effect transistors and bipolar transistors are both formed in a single layer on the same semiconductor member and provided with performance characteristics similar to those of separate discreet transistors.

Another object of the invention is to provide an improved method of manufacture of an integrated circuit, including both field effect transistors and bipolar transsistors, which is simple and economical and provides a high channel resistance that is reproduced with greater uniformity.

An additional object of the present invention is to provide an integrated circuit including both junction gated field effect transistors and bipolar transistors and a method of manufacture in which at least some of the elements of both transistors are formed simultaneously, and the channel portion is provided with a doping impurity concentration of lower slope than the concentration of the source, drain and base portions, which in turn is of less slope than the concentration of the emitter and top gate portions.

BRIEF DESCRIPTION OF DRAWINGS

Other objects and advantages of the present invention will be apparent from the following detailed description of preferred embodiments thereof and from the attached drawings of which.

DETAILED DESCRIPTION OF PREFERRED EMBODIMENT

Figures 1, 8:
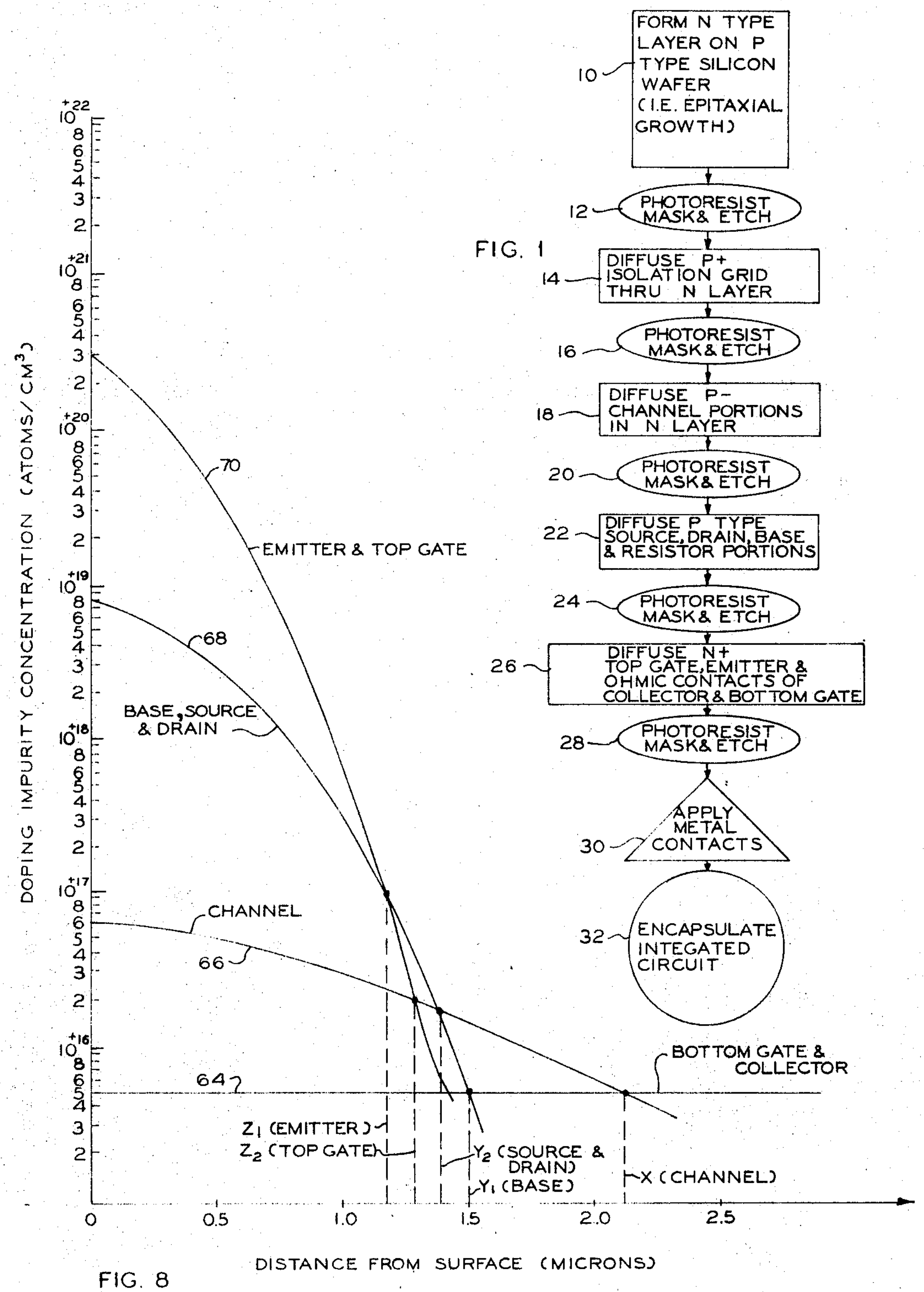
FIG. 1 is a block diagram of the steps in a method of manufacture of an integrated circuit in accordance with the present invention.
FIG. 8 shows the curves of doping impurity concentration vs. distance from the surface of the semiconductor member for elements formed by diffusion steps in the method of FIG. 1.

The monolithic integrated circuit of the present invention is formed on a single member of semiconductor material which may be a thin wafer of P type silicon containing boron or other acceptor impurities and having a resistivity of about 10 ohm centimeters. As shown in FIG. 1 the method of the present invention includes a first step 10 in which a single thin layer of N type silicon of a low uniform resistivity is formed on the wafer in a conventional manner such as by epitaxial growth. The epitaxial layer may have a resistivity of approximately 1 ohm centimeter and a thickness typically on the order of 10 microns. Next an etching step 12 is performed through an oxide layer previously formed, to provide a mask for the diffusion of an isolation grid in step 14.

The photoresist masking and etching step 12 may be performed by coating a photoresist layer on the surface of the silicon wafer, and exposing such photoresist layer to a light image in the form of an isolation grid on the region over the N type epitaxial layer. The unexposed portions of the photoresist layer corresponding to the isolation grid are removed by a solvent in accordance with conventional developing procedures. The remaining photoresist portions are baked to provide an etching mask, and the wafer is then etched in a buffered solution of hydrofluoric acid to provide the grid pattern apertures through the oxide layer to the surface of the N type epitaxial layer. Next the remaining photoresist portions are removed from the silicon wafer by a heated chromic sulfuric acid solution. This pattern etched oxide layer is then used as a diffusion mask in step 14.

After the photoresist masking and etching step 12, the isolation diffusion step 14 is accomplished by diffusing boron or other acceptor impurity through the openings in the etched silicon oxide layer into the N type silicon layer to form a P+ type isolation grid having a sheet resistance of 7 to 8 ohms per unit square. This isolation grid extends completely through the N type epitaxial layer to create a plurality of separate islands of N type silicon which are isolated from each other by PN junctions. The transistors are formed on these islands or isolated regions.

After cleaning another photoresist masking and etching step 16 is performed similar to that of step 12, in order to provide square apertures through the silicon oxide layer over the N type epitaxial layer in some of the isolated regions, such square apertures corresponding to the channel portions of the field effect transistors. Then a second diffusion step 18 is performed to diffuse boron or other acceptor impurity into the N type epitaxial layer to form channel portions of P— type silicon semiconductor material. These channel portions have a high sheet resistance of about 1000 to 4000 ohms per square.

A third photoresist masking and etching step 20 is then performed to provide apertures through the oxide layer over the channel portions corresponding to the source and drain, and over other regions of the N type layer corresponding to the bases of the bipolar transistors and the separate resistors. Next a third diffusion step 22 is performed through the oxide layer mask to provide P type regions of boron doped silicon having a sheet resistance of about 200 ohms per square which form the sources and drains of the field effect transistors, the bases of the bipolar transistors and the separate resistors. A fourth photoresist masking and etching step 24 is then performed to provide apertures through the silicon oxide layer corresponding to the top gate and the ohmic bottom gate contact of the field effect transistor, the emitter and ohmic collector contact of the bipolar transistor. After this a fourth diffusion step 26 employing phosphorous or other donor impurity is performed to provide regions of N+ type silicon which form the top gate in the channel portion and the bottom gate ohmic contact in the N type epitaxial layer of the field effect transistor, forming an emitter in the base portion and a collector ohmic contact in the N type layer of the bipolar transistors. These N+ portions may have a sheet resistance of 8 to 10 ohms per square.

A fifth photoresist masking and etching step 28 is performed after diffusion step 26 to provide apertures through the silicon oxide layer in the areas corresponding to the metal contacts to be applied to the field effect transistors, bipolar transistors and resistors. Next is the step 30 of applying the metal contacts to the semiconductor areas exposed by the etching step 28 to complete the integrated circuit. Finally there is an encapsulation step 32 whereby the integrated circuit is hermetically sealed within a container after the metal leads are connected to spaced insulated pins extending through the wall of such container.

The four diffusion steps 14, 18, 22 and 26 will now be described in detail with reference to FIGS. 2, 2A, 3, 3A, 4, 4A and 5, 5A, respectively corresponding to such steps.

Figure 2:
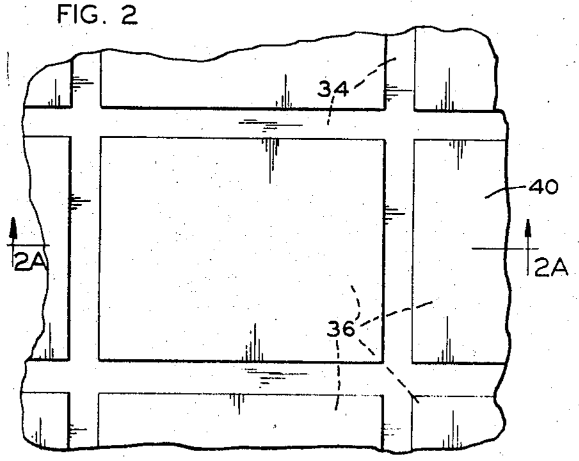
FIG. 2 is an elevation view of a portion of an integrated circuit being formed by the method of FIG. 1 after the isolation grid diffusion step.
Figure 2A:
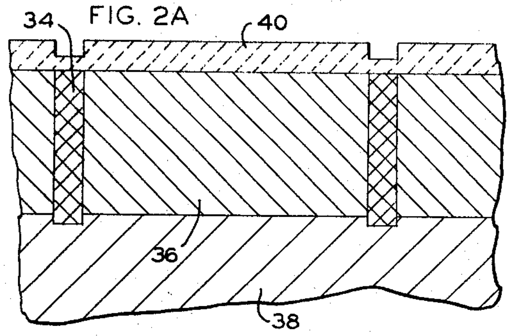
FIG. 2A is a horizontal section view taken along the line 2*a*–2*a* of FIG. 2.

As shown in FIGS. 2 and 2A, the isolation diffusion step 14 produces isolation portions 34 of P+ type silicon having a sheet resistance of about 7 to 8 ohms per square which extends completely through an N type epitaxial layer 36 formed on the surface of the P type silicon wafer substrate member 38. Thus the isolation portions may be in the form of a grid 34 which divides the N type layer 36 into a plurality of separate islands or regions which are isolated from each other by PN junctions. The N type layer 36 may have a uniform resistivity of about 1 ohm centimeter and a thickness of about 10 microns, while the base member 38 may have an uniform resistivity of about 10 ohm centimeters. An insulating layer of silicon dioxide 40 about 1 micron thick is formed over the outer surface of the N type layer 36 on exposure of the silicon to oxygen at an elevated temperature of about 1100° C. It should be noted that the thickness of the oxide layer 40 is less above the isolation grid 34 due to the etching through of such layer by step 12 to form the mask pattern for such isolation grid.

This isolation diffusion step 14 may be accomplished simultaneously on a plurality of wafers as follows. First, the patterned wafers with the N type layer 36 formed thereon are cleaned by placing them in a heated solution of chromic sulfuric acid for about 5 minutes and then rinsing in deionized water. Next the silicon wafers are boiled in a 2-to-1 solution of nitric and sulfuric acid for about 10 minutes and again rinsed in deionized water. After this cleaning procedure, the wafers are then dried and placed on the bottom of a deposition boat, whose top is provided with a coating of boron doping impurity on its underside. Next the boat is placed within a furnace and heated at 1125° C. in an inert atmosphere of nitrogen for 8 minutes after thoroughly degassing the boat. Then the boat is removed from the furnace and the wafers are placed in boiling water for about 15 minutes to remove any free boron compound left on the surface of the wafers. The atmosphere of the furnace is then adjusted to provide a mixture of nitrogen and oxygen. The wafers are rinsed in deionized water, dried, and then placed in another boat. As a result of this deposition heating step, a boron compound, such as boron oxide, is deposited over the surfaces of the wafers with boron being partially diffused into the exposed areas 34 of such wafers.

The second boat is then put back in the furnace and the wafers are again heated at the same temperature for 30 minutes to partially diffuse more boron doping impurity from the boron oxide compound into the silicon wafer through the isolation grid mask. After the semiconductor wafers are removed from the furnace, they are surface etched in a 4-to-1 solution of buffered hydrofluoric acid for 4 minutes to remove the boron oxide from such wafers. Next the wafers are rinsed in deionized water, and cleaned by boiling for 10 minutes in a 2-to-1 solution of nitric acid and sulfuric acid and again rinsed in deionized water. The remaining boron partially diffused into the wafers is then further diffused into the wafers to form the isolation grid 34 by placing the wafers back in the second boat and heating the boat in the furnace at 1125° C. in an atmosphere of humidified oxygen for sufficient time to enable the boron to penetrate through the N type layer 36 during the P— diffusion step 18 hereafter described. The boat is then removed from the furnace and cooled to complete the isolation diffusion step 14 of FIG. 1.

Figure 3:
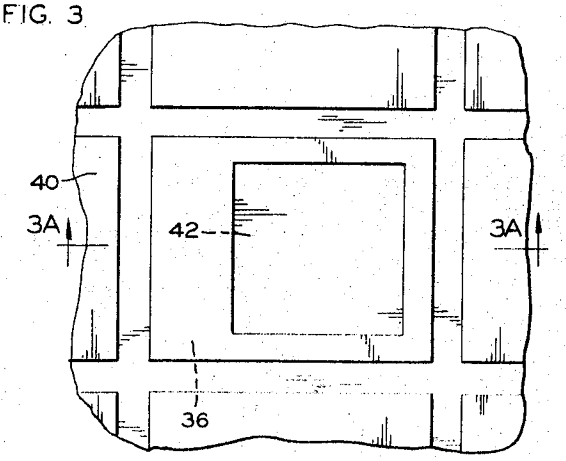
FIG. 3 is an elevation view of a portion of the integrated circuit formed after the channel diffusion step of FIG. 1.
Figure 3A:
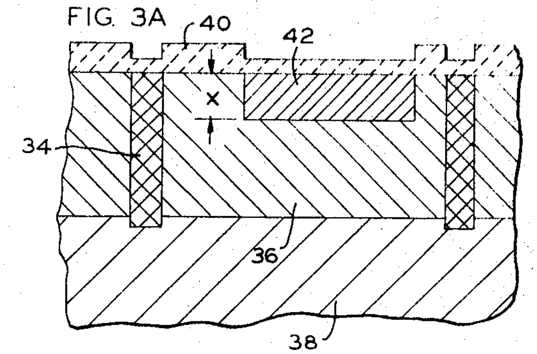
FIG. 3A is a horizontal section view taken along the line 3*a*–3*a* of FIG. 3.

As shown in FIGS. 3 and 3A, a channel portion 42 of P— type silicon semiconductor material is formed by diffusion step 18 in those isolated N type regions 36 which are to be used for the field effect transistors. This channel portion 42 may have a high sheet resistance of about 1000 to 4000 ohms per square. The channel diffusion step 18 is performed after the silicon wafers are masked and etched in step 16 to form aperatures through the silicon oxide layer 40 over those portions of the regions 36 corresponding to the channels 42 to be formed therein. First the silicon wafers are cleaned in the manner mentioned above, and then the wafers are placed in a deposition boat having a layer of boron doping impurity provided on the underside of the boat top. The boat is assembled in air and then placed in a furnace and heated at 940° C. for 15 minutes in an atmosphere consisting of a mixture of nitrogen and oxygen for deposition of the boron oxide compound on the silicon wafers and partial diffusion of the boron into the wafers. A mixture of 80% nitrogen and 20% oxygen is employed which is substantially the same as that of air in order to provide a furnace atmosphere matching the gas within the boat at the time the boat is inserted into the furnace. This mixture is believed to be necessary to achieve a high sheet resistance which is uniform over the surface of each wafer within the boat. Thus the sheet resistance only varies by approximately 3% along the entire length of the boat, which contains several wafers. After cooling, the boat is taken out of the furnace, the wafers are removed from the boat, and boiled in deionized water for about 15 minutes to remove any free boron compound from the surface. After drying, the wafers are then surface etched in a 4-to-1 solution of buffered hydrofluoric acid for about 45 seconds to remove the boron oxide from the surface of the wafers, and then rinsed with deionized water.

Next, the wafers are placed in another boat for further diffusion, after cleaning such wafers as described above. The second boat is then placed in a furnace and heated at a temperature of 1125° C. in an atmosphere of dry oxygen for 3 hours. Then the atmosphere is switched to humidified oxygen saturated with water and the boat heated for an additional 1½ hours. After this, the atmosphere is changed back to dry oxygen and heated for an additional 2½ hours. This makes a total heating time of 7 hours and completes diffusion of the boron doping impurity into the channel portion 42. As a result of this diffusion, the channel portions 42 are provided with a high sheet resistance of about 1000 ohms per square or more to a depth X of about 2.1 microns.

Figure 4:
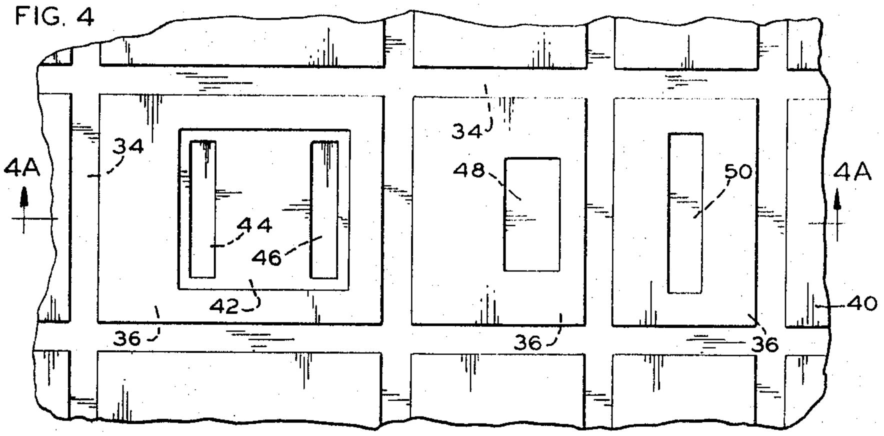
FIG. 4 is an elevation view of a portion of the integrated circuit formed after the source, drain, base and resistor diffusion step of FIG. 1.
Figure 4A:
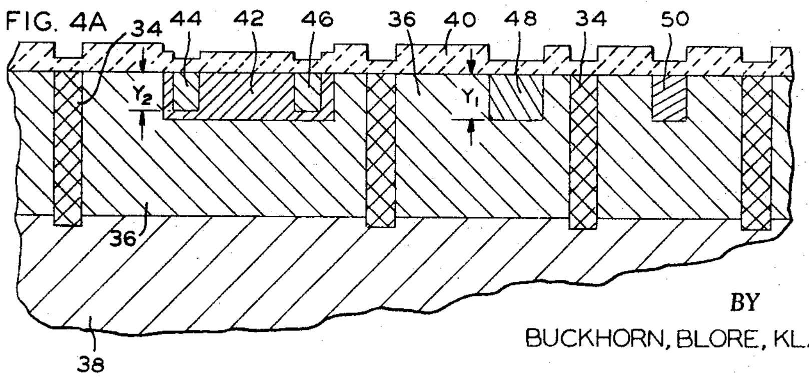
FIG. 4A is a horizontal section view taken along the line 4*a*–4*a* of FIG. 4.

As shown in FIGS. 4 and 4A, the diffusion step 22 of FIG. 1 simultaneously forms the source 44 and drain 46 of the field effect transistor, as well as the base 48 of the bipolar transistor and a resistor 50 on separate regions 36 of the semiconductor wafers. The source 44 and drain 46 are formed in the channel portion 42 with a depth $Y_2$ slightly less than the depth X of such channel portion. The depth $Y_1$ of the base 42 and the resistor 50 is believed to be slightly greater than the depth $Y_2$ of the source and drain because the former are diffused into semiconductor material 36 of lower doping impurity concentration than channel 42. This is shown in FIG. 8 hereafter discussed.

After the photoresist masking and etching step 20 of FIG. 1 to provide corresponding apertures through the silicon oxide layer 40, the diffusion step 22 is carried out in the following manner. First the silicon wafers are again cleaned in the manner previously described. The wafers are then dried and placed in a deposition boat having a layer of boron doping impurity coated on the underside of the boat top. The boat is then placed in a furnace and heated at 940° C. for 20 minutes in a nitrogen atmosphere, after degassing the boat. This deposition heating step deposits boron doping impurity on the wafers as a boron oxide compound and partially diffuses the boron in such wafers. The boat is then removed from the furnace and the wafers are again boiled in water to remove any free boron compound and placed in a 4-to-1 solution of buffered hydrofluoric acid for about 2 minutes to remove the boron oxide. After rinsing in deionized water, the wafers are again cleaned. Then the wafers are put in another boat which is placed within the diffusion furnace and heated at a temperature of 1125° C. for 15 minutes in a dry oxygen atmosphere, after which the atmosphere is switched to humidified oxygen and the heating continued for another 22 minutes, and then the atmosphere is changed back to dry oxygen and the heating continued for 30 minutes longer before removal of the wafers from the furnace. Thus the total diffusion heating time is 1 hour and 7 minutes and forms the source 44, drain 46, base 48 and resistor 50 portions with a sheet resistance of 200 ohms per square.

Figure 5:
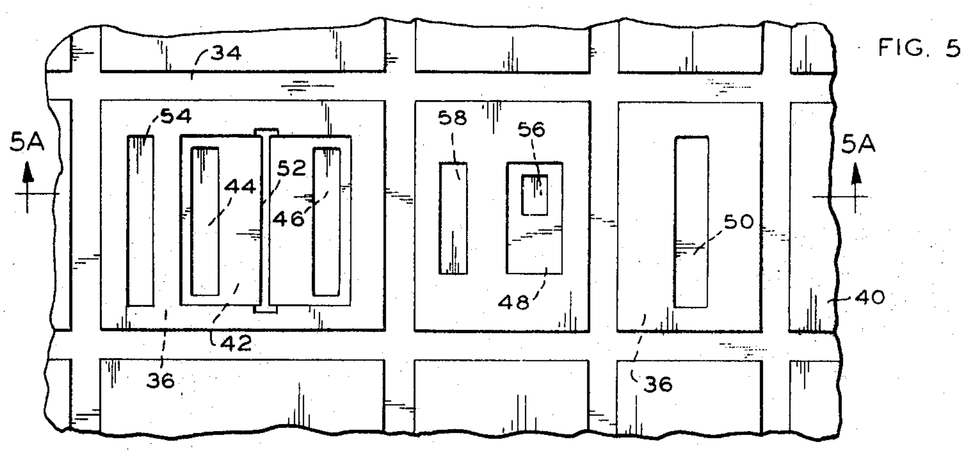
FIG. 5 is an elevation view of a portion of the integrated circuit formed after the top gate, emitter and ohmic contact diffusion step of FIG. 1.
Figure 5A:
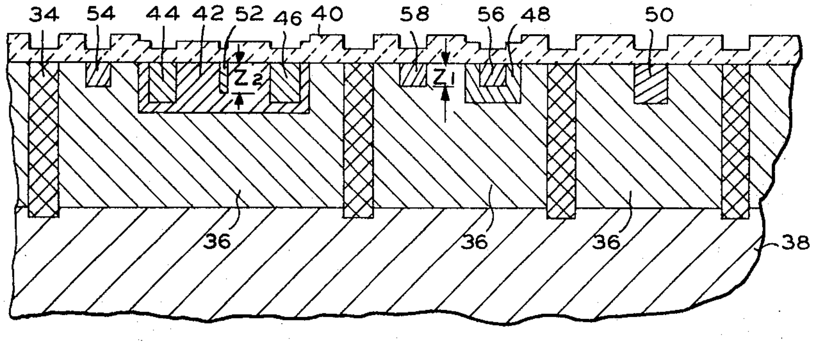

As shown in FIGS. 5 and 5A, a top gate 52 and a bottom gate ohmic contact 54 are provided for the field effect transistor, while an emitter 56 and a collector ohmic contact 58 are provided for the bipolar transistor simultaneously by the diffusion step 26 of FIG. 1. This diffusion step employs phosphorous or other donor doping impurity to form the elements with N+ type conductivity of a sheet resistance of 8 to 10 ohms per square. The depth $Z_1$ of the emitter 56 is less than the depth $Y_1$ of the base 58, and the depth $Z_2$ of the top gate 52 is less than the depth X of the channel portion 42. It should be noted that the depth $Z_1$ of the emitter is less than the depth $Z_2$ of the top gate because such emitter is diffused into the semiconductor material of greater doping impurity concentration.

The diffusion step 26 of FIG. 1 which forms the structure of FIGS. 5 and 5A is performed as follows. After the photoresist masking and etching step 24, the silicon wafers are cleaned and placed within a deposition boat having an open top. The boat is then placed in a deposition furnace and heated at 1000° C. in an atmosphere containing phosphorous oxychloride gas and a mixture of nitrogen and oxygen for approximately 26 minutes to deposit phosphorous doping impurity on the wafers and partially diffuse such phosphorous into such wafers. During this deposition step, the nitrogen and oxygen mixture is changed between a mixture of about 20 parts oxygen to 1 part nitrogen during the first minute, a mixture of about 20 parts oxygen to 1.12 parts nitrogen during the next 20 minutes, and an atmosphere entirely of oxygen is used during the last 5 minutes. The wafers are transferred to another boat which is inserted into the diffusion furnace and heated at a temperature of 900° C. in an atmosphere of humidified oxygen for 30 minutes to further diffuse the phosphorous into the silicon wafers to form the top gate 52, the bottom gate contact 54, the emitter 56 and the collector contact 58 portions of the integrated circuit and to provide an oxide thick enough to passivate and protect the junctions formed during the N+ deposition cycle.

The wafers are then annealed as follows. First, the wafers are cleaned, and then the wafers are again placed in the annealing boat which is positioned in the furnace and maintained at 800° C. for 16 hours in an atmosphere of argon.

Figure 6:
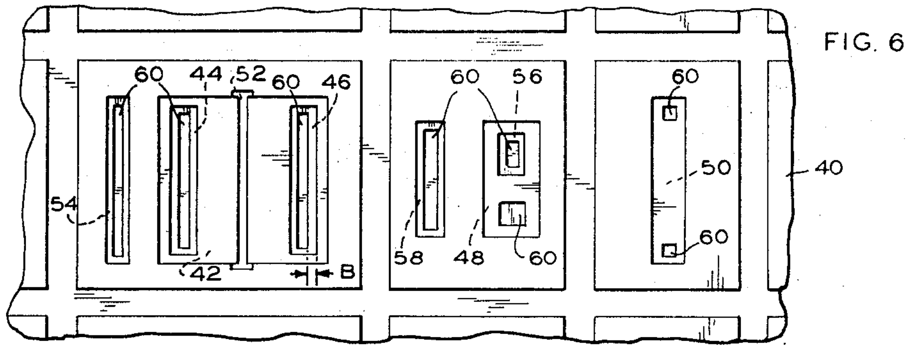
FIG. 6 is an elevation view of a portion of the integrated circuit formed after the etching step of FIG. 1 prior to attachment of the metal contacts.

As shown in FIG. 6, lead apertures 60 are etched through the silicon oxide layer 40 exposing inner portions of the electrodes of the field effect transistor, bipolar transistor and the passive circuit elements such as resistor 50 by step 28 of FIG. 1. Thus, the lead apertures 60 are surrounded by outer portions of the electrode or other semiconductor element with which they are associated. These outer portions on the field effect transistor form a P type semiconductor barrier between the metal leads and the adjacent semiconductor region to reduce leakage current. The thickness B of the barrier portion for the drain 46 between its associated lead aperture and channel 42 is shown in FIG. 6 for purposes of clarity. A similar barrier is provided for the source 44. These P type barriers are important to reduce leakage current in the field effect transistor which would otherwise occur due to the lightly doped P— channel portion at the oxide-silicon interface. It should be noted that the top gate 52 overlaps the channel 42 into the bottom gate region 36 and both of these gates are connected to the same source of D.C. supply voltage by the ohmic contact 54. For this reason, no lead aperture is provided over the top gate 52.

Figure 7:
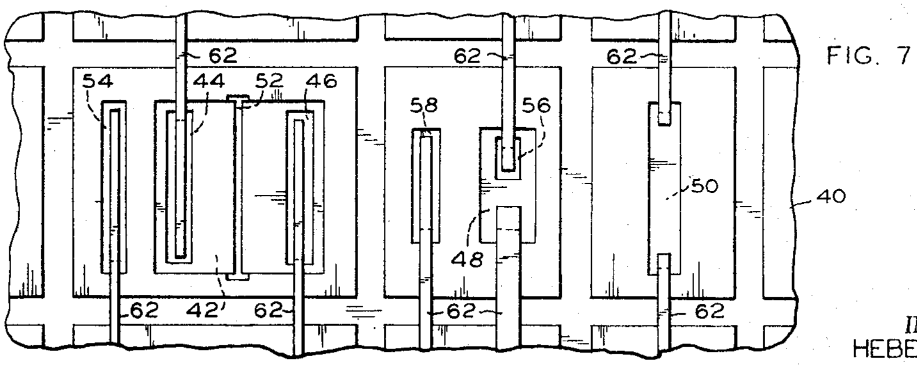
FIG. 7 is an elevation view of a portion of the integrated circuit formed after the metal contact attachment step of FIG. 1.

As shown in FIG. 7, leads 62 of any suitable metal, such as aluminum, are provided on the surface of the silicon wafers and through the lead apertures 60 into contact with the associated elements of the field effect transistor, the bipolar transistor and the resistor by step 30 of FIG. 1. The metal leads are insulated from the remaining portions of the semiconductor elements by the silicon oxide layer 40. Thus, the integrated circuit is now completed except for the encapsulation step 32 of FIG. 1, which may be performed in a conventional manner.

FIG. 8 shows the doping impurity concentration curves for the different elements of the field effect transistors and the bipolar transistors formed in the integrated circuit of the present invention by the method of FIGS. 1 to 7. The impurity concentration in atoms per cubic centimeter is plotted against distance from the surface in microns ($10^{-6}$ meter). Thus, the N type epitaxial layer 36 which forms the bottom gate of the field effect transistor and the collector of the bipolar transistor has a uniform impurity concentration 64 which remains substantially constant at about $0.5\times10^{+16}$ atoms per cubic centimeter. The impurity concentration curve 66 of the channel portion 42 of the field effect transistor varies from a surface concentration of about $.6\times10^{+17}$ atoms per cubic centimeter to an impurity concentration of about $.5\times10^{+16}$ atoms per cubic centimeter at a depth X of about 2.1 microns. The depth X of the P type channel is determined when its impurity concentration equals the concentration of the N type epitaxial layer 36 to form a PN junction therewith. The impurity concentration 66 of the channel has a very low average slope of less than $0.5\times10^{+17}$ atoms per cubic centimeter per micron, and, for example, only changes about $55\times10^{+15}$ atoms per cubic centimeter throughout its depth of 2.1 microns so that the average slope is about $2.6\times10^{+16}$ atoms per cubic centimeter per micron. The impurity concentration 68 of the base 48, source 44, drain 46 and the resistor 50 decreases from a surface concentration of about $0.8\times10^{+19}$ atoms per cubic centimeter to a concentration of about $0.5\times10^{+16}$ where it equals the concentration of the epitaxial layer at a distance $Y_1$ of about 1.5 microns, which is the depth of the base portion and the point where it forms a PN junction with the collector. Thus the impurity concentration curve 68 changes by about $7995\times10^{+15}$ atoms per cubic centimeter in a shorter distance than the channel concentration curve 66. Therefore curve 68 has a much greater slope than the channel concentration curve 68. It should be noted that the source and drain have a depth $Y_2$ of about 1.4 microns, which is believed to be less than the depth $Y_1$ of the base, because the depth of such source and drain is determined at the point where their concentration curve 68 crosses the channel concentration curve 66.

Another impurity concentration curve 70 is shown for the emitter 56, collector contact 58, top gate 52 and bottom gate contact 54, which are all formed by the same diffusion step 26 of FIG. 1. Impurity concentration curve 70 decreases from a surface concentration of about $0.3\times10^{+21}$ to a concentration of about $0.2\times10^{+17}$ at a depth $Z_2$ of 1.3 microns where such curve crosses the channel concentration curve 66 to form the PN junction between the top gate 52 and the channel 42. This is a change in concentration of about $29,998\times10^{+16}$ atoms per cubic centimeter, which is much greater than the change in concentration of curves 66 and 68. Therefore, the emitter and top gate impurity concentration curve 70 has a much greater slope than either the base, source and drain concentration curve 68 or the channel concentration curve 66. Again, it should be noted that the emitter is formed with a depth $Z_1$ of about 1.2 microns corresponding to the intersection of curve 70 with curve 68, since this is where the emitter to base PN junction is formed. Thus the depth of the emitter $Z_1$ is less than the depth $Z_2$ of the top gate even though such elements are formed by the same diffusion step. Of course, the reason for this is that the impurity concentration of the emitter equals that of the base before the impurity concentration of the top gate equals that of the channel, since the base has a higher impurity concentration than such channel in the regions less than about 1.5 microns from the surface.

From the above description, it is clear that the channel portion has a doping impurity concentration 66 of lower surface value and lower slope than any other diffused element of the field effect transistors and the bipolar transistors. Providing the high resistance channel portion with an impurity concentration 66 having a low surface value and a low slope, causes the depth of the channel to remain substantially the same in spite of the later deposition and diffusion steps necessary for forming other elements of the transistors. This enables the field effect transistors to be made with more consistent electrical characteristics which is important for commercial reproducibility and circuit design.

It will be obvious to those having ordinary skill in the art that many changes may be made in the above described details of the preferred embodiment of the present invention without departing from the spirit thereof. In this regard, it has already been mentioned that the top gate portion 52 may be eliminated entirely in order to provide a PN junction gated field effect transistor having a single gating junction only beneath the channel portion. Also other types of diffusion techniques can be employed including deposition of the doping impurity onto the silicon wafers from a doping gas introduced into the furnace rather than by providing the doping material as a coating on the top of a furnace boat. Therefore, the scope of the present invention should only be determined by the following claims.

I claim:

1. A method of manufacture of an integrated circuit including field effect transistors and bipolar transistors, comprising the steps of:

forming a layer of semiconductor material of one type of conductivity on a substrate member of semiconductor material of the opposite type of conductivity to form a PN junction therewith, said layer being of a substantially uniform resistivity;

diffusing doping impurities into selected regions of said layer of semiconductor material to form a plurality of field effect transistors on said member in which the channel portions of said field effect transistors are formed by a separate diffusion step different from that employed to form any other element of the field effect transistors or the bipolar transistors;

diffusing doping impurities into different regions of said layer of semiconductor material to form a plurality of bipolar transistors on said member which are isolated from said field effect transistors, at least some of the elements of said bipolar transistor being formed simultaneously with the formation of elements of said field effect transistor by the same diffusion step; and forming a plurality of separate insulated electrical leads on said member which are connected to the elements of said field effect transistors and said bipolar transistors.

2. A method in accordance with claim 1 in which the channel portions are diffused so as to have a doping impurity concentration of lower surface value and lower average slope than any other diffused element of the field effect transistors and the bipolar transistors.

3. A method in accordance with claim 2 in which the diffusion steps are such that the rate of decrease of impurity concentration with distance from the surface of the semiconductor member and the surface concentration are less for the channel portion of the field effect transistor than for said source, drain and base, and are less for said source, drain and base than for the emitter of the bipolar transistor.

4. A method in accordance with claim 2 in which the impurity concentration of the channel is formed with a surface value less than about $10^{+17}$ atoms per cubic centimeter and an average slope of less than about $0.5 \times 10^{+17}$ atoms per cubic centimeter per micron.

5. A method in accordance with claim 1 in which the layer of substantially uniform resistivity is formed by epitaxial growth.

6. A method in accordance with claim 5 which includes the steps of placing the semiconductor member within a furnace boat containing the doping impurity material, heating said boat within a furnace containing a gas atmosphere which is substantially the same as the gas within said boat prior to this heating step in order to uniformly deposit the doping material on said semiconductor member, and thereafter again heating the semiconductor member to diffuse the doping material into said member to form said channel portions.

7. A method in accordance with claim 6 in which the boat is loaded with the semiconductor member in air outside the furnace and said gas atmosphere provided in the furnace is a mixture of about 20% oxygen and 80% nitrogen.

8. A method in accordance with claim 1 in which the field effect transistors are of the PN junction gated type and both the field effect transistors and the bipolar transistors are formed entirely within the layer of uniform resistivity.

9. A method in accordance with claim 8 in which the field effect transistors are each provided with a gating junction only beneath the channel portion of said field effect transistor.

10. A method of manufacture of an integrated circuit including junction gated field effect transistors and bipolar transistors, comprising the steps of:

forming a layer of semiconductor material of one type of conductivity on a substrate member of semiconductor material of the opposite conductivity to form a PN junction therewith, said layer being of a substantially uniform resistivity;

isolating a plurality of separate regions of said layer by PN junctions;

diffusing a doping impurity into at least some of said regions to provide the channel portions of the junction gated field effect transistors with a certain depth and resistivity, said channel portions being formed by a separate diffusion step different from that employed to form any other element of the field effect transistors or the bipolar transistors and being of a conductivity opposite to that of said regions to form PN junctions therewith which are gating junctions of the field effect transistors;

diffusing a doping impurity simultaneously into said channel portion to form the sources and drains of said field effect transistor and into others of said regions to form PN junctions therewith and provide the bases of the bipolar transistors, said sources, drains and bases being of the same type of conductivity as said channel portions but of a higher degree of conductivity and of less depth than said channel portions;

diffusing a doping impurity simultaneously into the regions containing a channel portion to form gate contacts of the field effect transistors and into the base portions to form a PN junction therewith and provide the emitters of the bipolar transistors, as well as into the regions containing a base portion to provide collector contacts, said gate contacts and collector contacts being of the same type of conductivity but of a higher degree of conductivity than said regions, and said emitter being of opposite conductivity and less depth than said base portion; and coating a plurality of insulated, electrical leads on the semiconductor member which are each connected to one of the electrodes including the gate, source and drain of the field effect transistors and the base, emitter and collector of the bipolar transistors.

11. A method in accordance with claim 10 in which at least some of the leads are provided in contact with only an inner portion of the electrode and are surrounded by an outer portion of the electrode which forms a barrier against current leakage to adjacent semiconductor areas.

12. A method in accordance with claim 10 in which passive circuit components, such as resistors, are formed simultaneously with the formation of elements of said transistors by the same diffusion step, on different semiconductor regions.

13. A method in accordance with claim 10 in which the layer of semiconductor material is formed by epitaxial growth, the field effect transistors and the bipolar transistors are both formed entirely within said layer, and the isolating step is accomplished by diffusing a doping impurity in a grid pattern completely through the semiconductor layer to the substrate member to form an isolation grid which isolates such regions from each other, said grid having the same type of conductivity as the substrate but having a higher degree of conductivity.

References Cited

UNITED STATES PATENTS

| | | | |
|---|---|---|---|
| 3,210,677 | 10/1965 | Lin et al. | 317—235 |
| 3,299,329 | 11/1967 | Pollock | 317—235 |
| 3,391,035 | 7/1968 | Mackintosh | 148—189 |
| 3,404,450 | 10/1968 | Karcher | 317—235 |

L. DEWAYNE RUTLEDGE, Primary Examiner

R. A. LESTER, Assistant Examiner

U.S. Cl. X.R.

29—571; 148—187; 317—235